(12) United States Patent
Nadal Guardia (10) Patent No.: US 6,965,247 B2
(45) Date of Patent: Nov. 15, 2005

(54) SEMICONDUCTOR DEVICE FOR DETECTING AND ADJUSTING A THRESHOLD VALUE VARIATION

(75) Inventor: Rafael Nadal Guardia, Munich (DE)

(73) Assignee: Infineon Technologies, AG, (DE)

( * ) Notice: Subject to any disclaimer, the term of this patent is extended or adjusted under 35 U.S.C. 154(b) by 150 days.

(21) Appl. No.: 10/707,227

(22) Filed: Nov. 28, 2003

(65) Prior Publication Data

US 2004/0135142 A1  Jul. 15, 2004

(30) Foreign Application Priority Data

Nov. 28, 2002  (EP) ................................. 02026803

(51) Int. Cl.[7] ............................................. G01R 31/26
(52) U.S. Cl. ....................... 324/763; 324/765; 324/769
(58) Field of Search ................................ 324/763–769, 324/158.1, 73.1; 257/40, 48; 438/14–18; 714/724, 733–734; 327/52

(56) References Cited

U.S. PATENT DOCUMENTS

| | | | |
|---|---|---|---|
| 4,789,825 A | * | 12/1988 | Carelli et al. ............... 324/765 |
| 5,565,799 A | * | 10/1996 | Houston ...................... 327/52 |
| 5,648,920 A | | 7/1997 | Duvvury et al. |
| 5,777,518 A | | 7/1998 | Bailey |
| 6,275,972 B1 | | 8/2001 | Long et al. |

OTHER PUBLICATIONS

Walker et al., "A Parallel Measurement System for the Extraction of Level 3 Spice Parameters", Proc. IEEE Int. Conf. On Microelectronic Test Structure, Edinburgh XP010000918, p. 135, left-hand col., lines 1-140. right-hand col. last line. Figure 1a. (Mar. 1990).

* cited by examiner

Primary Examiner—Vinh P. Nguyen
(74) Attorney, Agent, or Firm—Moore & Van Allen PLLC; Steven B. Phillips (57) ABSTRACT

The present invention generally relates to a semiconductor device and more specifically to a semiconductor device for detecting and adjusting threshold voltage variations of an integrated semiconductor device implemented in sub-micron technology, i.e. transistors, and a method related thereto. To adjust the threshold voltage variation induced by the fabrication process in the semiconductor a comparison between a device under test and a fixed voltage value is provided. According to the invention, a constant current is injected in the transistor and the gate-to-source potential is fixed by a bias voltage. According to the comparison result, a well potential is provided to the semiconductor device to adjust the threshold voltage.

11 Claims, 9 Drawing Sheets

SEMICONDUCTOR DEVICE FOR DETECTING AND ADJUSTING A THRESHOLD VALUE VARIATION

BACKGROUND OF INVENTION

The present invention generally relates to a semiconductor device and more specifically to a semiconductor device for detecting and adjusting a change of the threshold voltage value of an integrated semiconductor device implemented in sub-micron technology, i.e. transistors, and a method related thereto.

Figure 1:
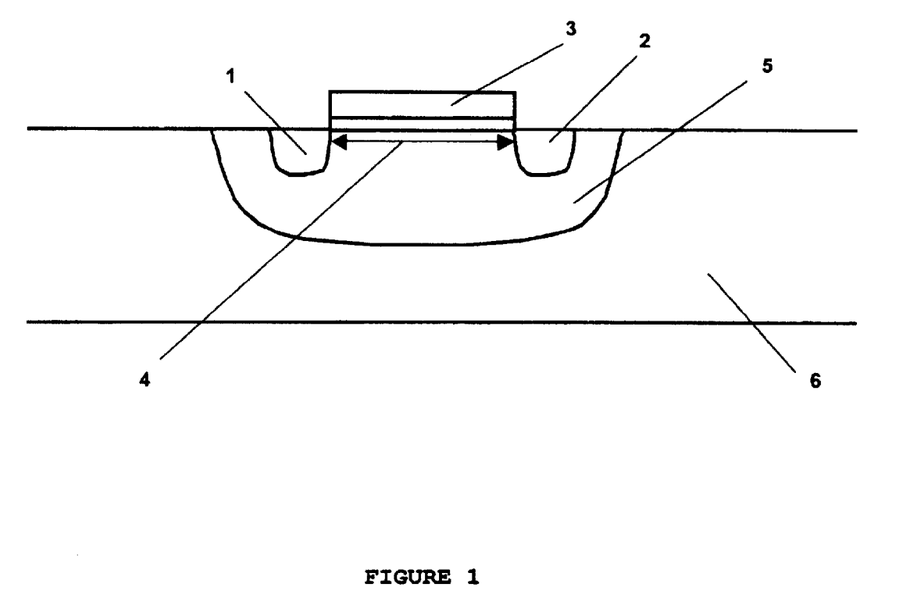
FIG. 1: a cross-section of an NMOS transistor from the state of the art.
Figure 2:
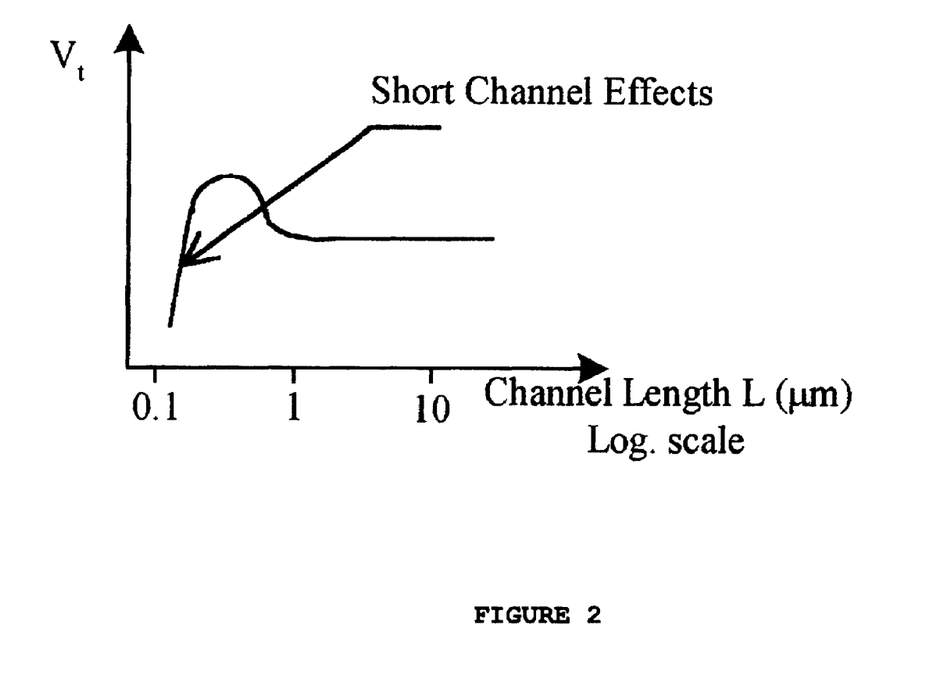
FIG. 2: a diagram of the qualitative evolution of the threshold voltage value versus the channel length.

Recent measurements taken on NMOS and PMOS transistors implemented in sub-micron technologies (particularly below 130 nm channel length) have shown a great dependence of the threshold voltage values of the transistors on the channel length. Transistors realised in sub-micron technology provide a channel length below 1 μm. FIG. 1 shows a cross-section of a state of the art NMOS transistor in sub-micron technology on a bulk or wafer 6. The distance between n-doped-source 1 and -drain 2 under gate 3 in a p-doped-well 5 is referred to as the channel length 4. A small channel length variation that may be caused by tolerances in the fabrication process, can shift the threshold voltage value around 80 mV. FIG. 2 shows the qualitative evolution of the threshold voltage value versus the channel length L in logarithmic scale. When minimum length transistors with low threshold voltage values ($V_t$) are implemented (with $V_t$ in the range from 0 mV to 400 mV), a small variation of the channel length has great impact on the threshold voltage value (see FIG. 2). This effect is referred to as Short Channel Effect. Therefore, the threshold voltage value shift due to the uncertainty introduced in the channel length has a great impact in the performance of the device. Moreover, the impact on the performance of the circuits provided with these transistors is also highly affected in terms of static and dynamic terms. For digital circuits, static and dynamic power consumption increases and the performance in terms of speed is also affected. With regard to these problems, it is necessary to implement any kind of strategy capable to determine a change in the threshold voltage value $V_t$ caused by variations in the channel length of minimum length devices (NMOS and PMOS transistors).

Besides the shifting in $V_t$ due to variations in the channel length L, $V_t$ can also change by reason of the doping dose used to implant the channel or a change in the thickness of the gate oxide. These two technology parameters, the doping dose and thickness of the oxide, will determine the status of the transistors. Three different status are allocated, fast, nominal and slow corresponding to small, nominal and high value of $V_t$, respectively. Short channel effects can appear in any of these statuses of the technology.

Several strategies have been reported to establish a certain well potential bias in digital circuits when this bias is necessary. Well-known strategies are based on delay lines and off current detection. Delay lines are formed by several transistors in series. Therefore, a change of the $V_t$ value of the transistors changes the introduced delay. In dependence on the introduced delay the well potential bias is applied. The strategy based on delay lines can also be realised using critical path replicas. U.S. Pat. No. 6,091,283 describes a sub-threshold leakage tuning circuit which aims to compensate for process, activity and temperature-induced device threshold variations in a semiconductor circuit having a transistor, a potential of the gate wherein the transistor is held to a preset sub-threshold potential and a channel current of the channel region is compared with a reference current to obtain a comparison result. A bias potential of a substrate is adjusted according to the comparison result to hold the subthreshold current at the reference current. The reference current is provided by a separate reference source. The device under test (DUT) is configured in a circuit in which the current is compared with said isolated reference current. The method only provides a solution for compensation for changes in device characteristics across process and temperature.

Another well-known strategy is based on detection of the off current. However, most of these strategies require the use of reference devices in order to establish a fixed ratio between the current in the device under test and the current in reference device.

SUMMARY OF INVENTION

It is thus an object of the invention to provide a semiconductor device and a method capable of detecting the change of $V_t$ due to short channel effects or due to a change towards the fast status of the technology whereby not requiring a reference circuit using highly stable and very well known devices. It is further an object of the invention to provide a semiconductor device and a method to adjust the $V_t$ value by means of well potential control.

The object of the invention is met by a semiconductor device that comprises a test circuit containing at least one transistor as a device under test (DUT) having a drain, a source, a gate and a channel region under the gate between the drain and the source in a well with a short channel length, a reference circuit providing a fixed reference voltage value, a bias circuit applying a bias voltage to the gate of the device under test (DUT), a current circuit providing a fixed current to the drain of the device under test (DUT), a comparator circuit comparing the voltage at the drain of the test circuit with the output of the reference circuit and providing a comparison result.

The new method is based on the use of a DUT or a set of devices under test connected in parallel, implemented with minimum length, which are compared with a reference circuit that provides a fixed voltage. The reference circuit is advantageously realised by a voltage source with a constant output voltage. In contrast to known semiconductor devices, the device under test (or a set of parallel DUTs) is not compared with a reference device. According to the present invention the control of the well potential is not established by means of comparison of the DUT with a reference device so that it is not necessary to have highly stable and very well known reference devices. In the proposed invention no reference devices are required, but simply a fixed voltage is taken as a reference for any kind of operating temperature and operating conditions. A circuit design in the proposed semiconductor device according to the present invention allows detection of the variation of $V_t$ corresponding not only to short channel effects, but also to the fast status of the transistor. All changes in $V_t$ are detected whatever is the origin.

According to the present invention, no cut-off or saturation currents are measured. But the $V_{ds}$ voltage drop of the device under test (or a set of devices under test connected in parallel) is measured when a fixed current is injected in the drain of the DUT by the current circuit. The DUT is operated as a switch in which the input voltage is the well potential and the gate-to-source voltage is fixed. In the semiconductor device of the proposed invention the bias voltage supplied to the gate of the DUT is provided by a bias circuit whereby the gate is preferably supplied with a value close to the threshold voltage value of the transistor. When the $V_t$ changes, the transistor can switch because of the input voltage supplied to the well. If the $V_t$ does not decrease enough or increases, the applied voltage in the well changes the $V_t$ but not enough to allow the transistor to change the operating region from cut-off to saturation and thus no change in the output of the test circuit is detected by the comparator. Moreover, the change in the equivalent resistance of the transistor due to a change in the regime of operation is easily detected monitoring the voltage drop due to the fixed current injected in the drain of the DUT. The bias circuit preferably comprises a bandgap reference circuit that provides a constant voltage.

Advantageously, the current circuit comprises a current source and a current mirror circuit connected between said current source and the drain contact of the DUT. With the temperature independent current mirror between the current source and the drain contact of the DUT, the current provided by the source is copied into the DUT.

Adjustment of the threshold voltage is carried out comparing the output voltage of the test circuit and the reference voltage. When the output voltage of the test circuit is higher than the output voltage of the reference circuit the well potential of the DUT is not adjusted. When the output voltage of the test circuit is smaller, the well potential is decreased for the NMOS DUTs and increased for the PMOS DUTs. The well potential is changed up to the point in which the output of the test circuit is equal to the output of the reference circuit.

In a preferred embodiment a well potential generator is provided for generating a well potential, whereby said well potential generator is coupled to the output of the comparator circuit receiving the comparison result as an input and to a well contact of the DUT for applying the well potential as an output. The well potential generator allows the semiconductor device according to the invention to control the current consumption by adjusting the well potential to a desired value. Preferably, said well potential generator comprises a charge pump as a voltage source. Thus, the well potential generator applies the well potential to the well contact of the DUT when the received comparison result indicates that the output voltage of the test circuit is smaller than the output voltage of the reference circuit, preferably up to the point in which the received comparison result indicates that the output voltage of the test circuit is equal to the output voltage of the reference circuit.

In a further development of the inventive semiconductor device said well potential generator comprises a voltage source for providing a fixed potential to the well of the DUT and the well of further devices of a digital circuit wherein said digital circuit is integrated in the semiconductor device.

When the online detection of the $V_t$ variation is implemented in a die with other digital circuits, the adjustment of the well potential can be carried out for all the devices in each circuit. By doing so, the current consumption during the dynamic operation would be reduced without penalty to the designed performance of the circuits. The performance is not degraded because the circuits are designed to properly work in the nominal status of the transistor. When a well potential is applied the $V_t$ value increases so that the adjustment would be addressed to shift the DUT from fast to nominal status. As the $V_t$ of the other devices is also increasing, the other digital circuits have less leakage current in state and dynamic operation. It is understood that said well potential generator can be implemented on the same bulk or substrate as the test circuit but may also be an external circuit.

The object of the invention is also met by a method for detecting variations of the threshold voltage $V_t$ in a semiconductor device in sub-micron technology comprising a test circuit containing at least one transistor as a device under test (DUT) having a drain, a source, a gate and a channel region under the gate between the drain and the source in a well with a short channel length. Said method comprises the steps providing a fixed reference voltage value by a reference circuit, applying a bias voltage to the gate of the device under test (DUT) by a bias circuit, providing a fixed current to the drain of the device under test (DUT) by a current circuit and comparing the voltage at the drain of the test circuit with the output of the reference circuit and providing a comparison result by a comparator circuit.

Without limiting the scope of protection a preferred embodiment of the general invention is explained with reference to the accompanying drawings.

DETAILED DESCRIPTION

Figure 3:
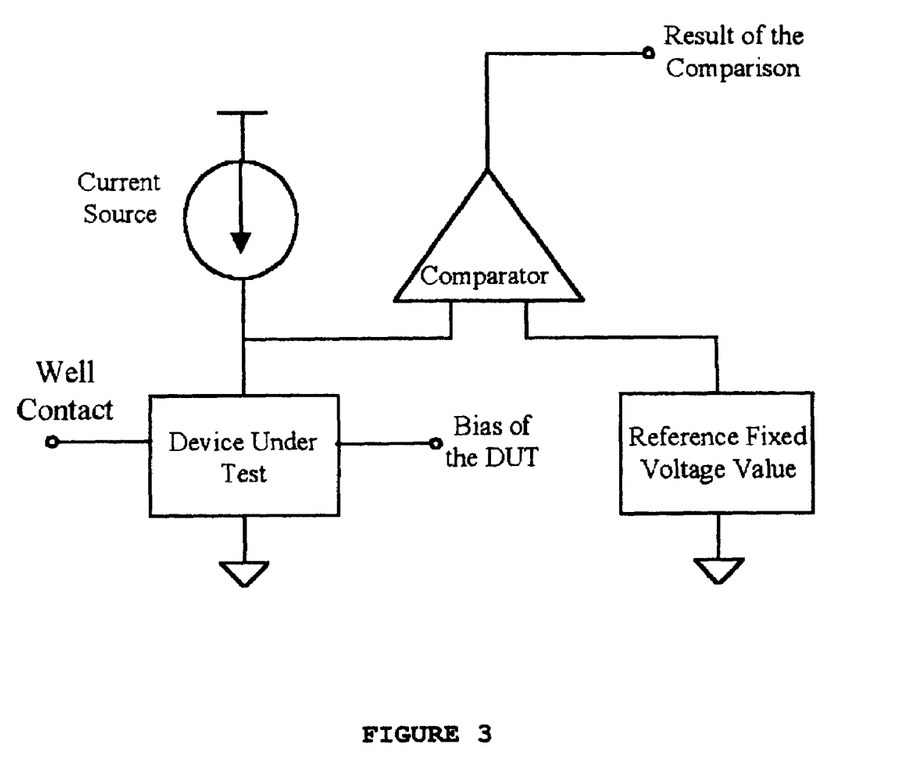
FIG. 3: a block diagram of the proposed detection method for threshold voltage variations due to short channel effects whereby the configuration is based on NMOS DUTS.

As shown in FIG. 3, three constitutive circuit blocks are required for detecting the $V_t$ value variations. A first circuit block with a device under test (DUT), a second circuit block providing a reference fixed voltage value and a third circuit block with a comparator for comparing the outputs of the test circuit and the reference circuit. The comparator provides a comparison result at its output. The gate contact of the DUT in the test circuit is coupled to a bias circuit of the DUT that provides a bias voltage. The drain contact is coupled to current circuit in which a current source provides a current injected into the DUT. The circuits are integrated on one wafer.

According to the present semiconductor device the DUT is operated as a switch, which has as an input voltage the well potential. The potential at the gate is fixed to a value close the threshold value of the transistor (DUT) by the bias of the DUT. When the $V_t$ changes the transistor is able to switch because of the input voltage applied to the well. If the $V_t$ does not decrease enough or increases, the applied voltage in the well changes the $V_t$ only to a small extent but not enough to allow the transistor to change the operating region. Thus, no change in the output of the test circuit is detected by the comparator. Moreover, the change in the value of the equivalent resistor representing the transistor caused by a change in the regime of operation is easily detected by monitoring the voltage drop due to the injected fixed current.

Figure 4:
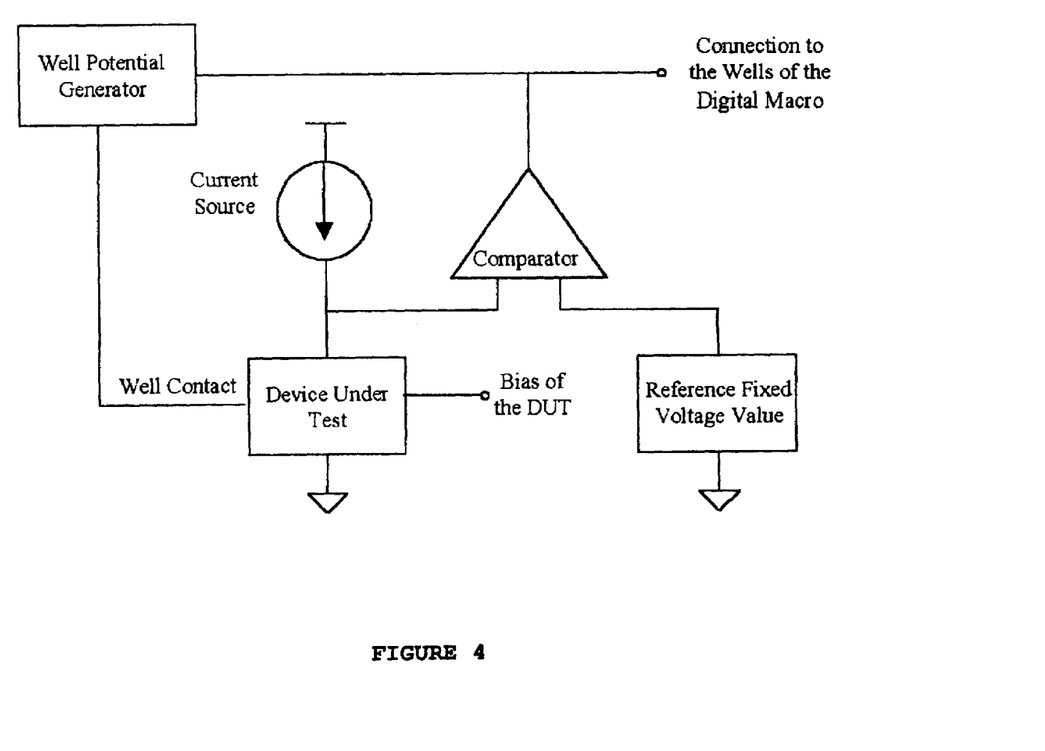
FIG. 4: a block diagram of the proposed leakage current control method whereby the configuration is based on NMOS DUTS.

In order to control the current consumption of the circuit a change in the $V_t$ value has to be detected and adjusted by a system capable to adjust the well potential to the desired value as it is shown in FIG. 4. The well potential can be applied by a charge pump in a well potential generator, for instance. The well potential generator receives as an input the comparison result provided by the comparator and is coupled to a well contact of the DUT. Adjustment of the threshold voltage is carried out comparing the output voltage of the test circuit and the reference fixed voltage value. When the output voltage of the test circuit is higher than the reference fixed voltage value, the well potential of the DUT is not adjusted. When the output voltage of the test circuit is smaller, the well potential is decreased for NMOS DUTs and increased for PMOS DUTs. The well potential is changed up to the point in which the output of the test circuit is equal to the output of the reference circuit. The comparator would switch on or switch off the well potential generator. The generated well potential is not only applied to the well contact of the DUT but also to the well contacts of other digital circuit integrated in the same die.

Figure 5:
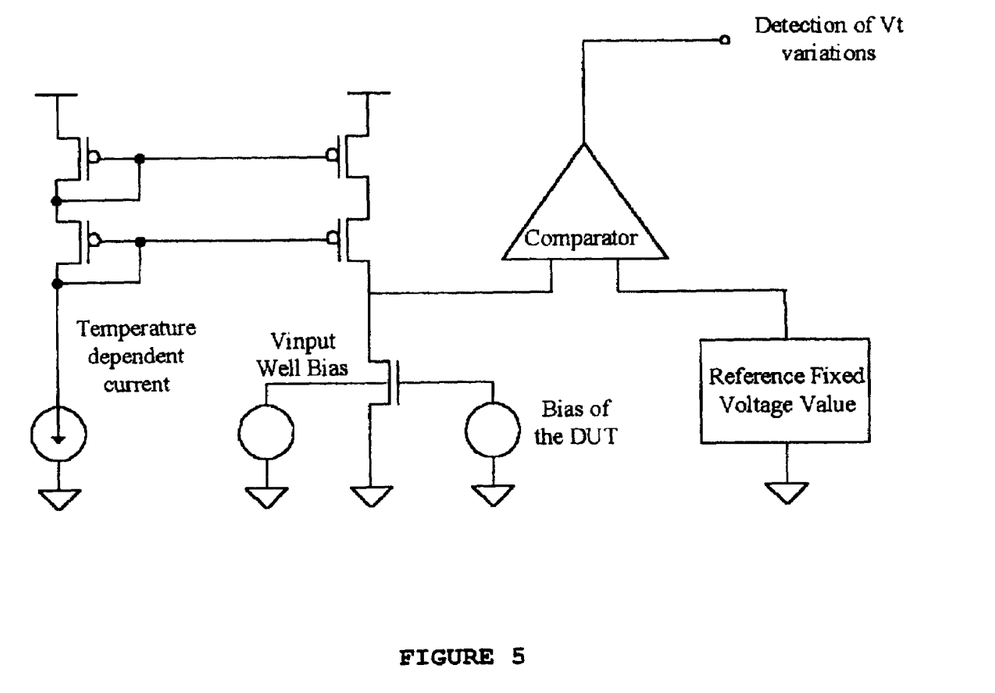
FIG. 5: a block diagram of the transistor configuration using a cascade current mirror to inject the current in the DUT.

As depicted in FIG. 5, the semiconductor device in which the device under test is sensed comprises a temperature dependent current source and a current mirror to inject the current in the drain contact of the DUT. The device further comprises a circuit to fix the operating voltage at the gate of the DUT (bias of the DUT), whereby this circuit is realized by a bandgap reference. The device further comprises a comparator and a fixed reference voltage to be applied to the comparator. It is also important to notice that the dependence in temperature of the DUT can be balanced using a current with the opposite temperature slope. Then the current would be generated with a PTAT and a $V_{be}$ circuit, such kind of circuits are usually used in temperature sensors and bandgap references. The combination of the output of the PTAT circuit and the output of the $V_{be}$ circuit would allow to achieve the desired slope of the current that is to be injected in the DUT. The PTAT circuit provides a current proportional to the absolute temperature and the $V_{be}$ circuit provides an output proportional to the voltage drop between the base and the emitter of a bipolar transistor. As it can be seen in FIG. 5, the generated current would be connected to the input of the current mirror in the place of the ideal current source. The input of the circuit would be the terminal corresponding to the well connection of the DUT.

The proposed invention uses a bias voltage of the DUT to provide a gate-source voltage drop a little bit smaller than the threshold voltage value for the nominal and the slow status of the transistor. By doing so, in slow and nominal status the DUT is working in cut-off regime. When $V_t$ changes and reaches smaller values due to short channel effects or to the fast status, the DUT works in saturation regime because the voltage bias at the gate of the transistor is bigger than the new value of $V_t$. In this scenario, the resistance introduced by the transistor in the current path changes and therefore the output of the circuit at the drain, which is connected to the input of the comparator, also changes. Applying a bias voltage to the well, the $V_t$ is shifted to the desired value, the transistor is forced to work in cut-off regime again.

Figure 6:
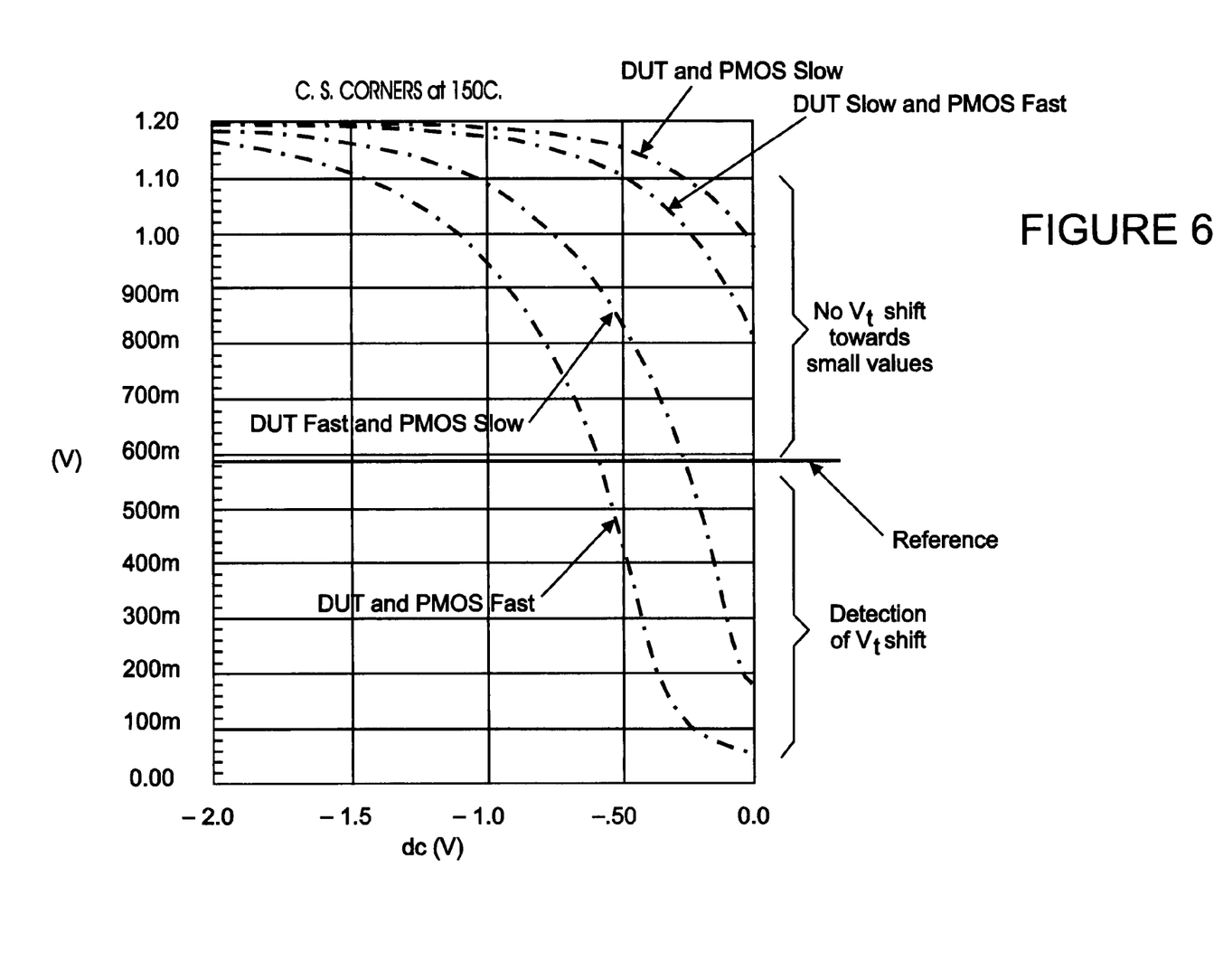
FIG. 6: a diagram showing the values of the voltages at the input of the comparator when a temperature dependent current source is used to bias the current mirror.

The simulations results depicted in FIG. 6 show the inputs of the comparator in dependence of the well bias, It can be seen that if a reference fixed voltage value of 600 mV is used to determine if the value of the threshold voltage has changed, only the cases in which the NMOS-DUT is in fast status are detected. In the other cases, the output of the test circuit is higher than the reference voltage. It is interesting to notice that the circuit is sensitive to the status of the PMOS transistors used to implement the current mirror. However, this sensitivity is low enough to allow a detection of the fast status of the DUT. The stability in temperature has been also checked and the required slope in temperature to balance the dependence of the DUT has been also obtained and injected.

Figure 7:
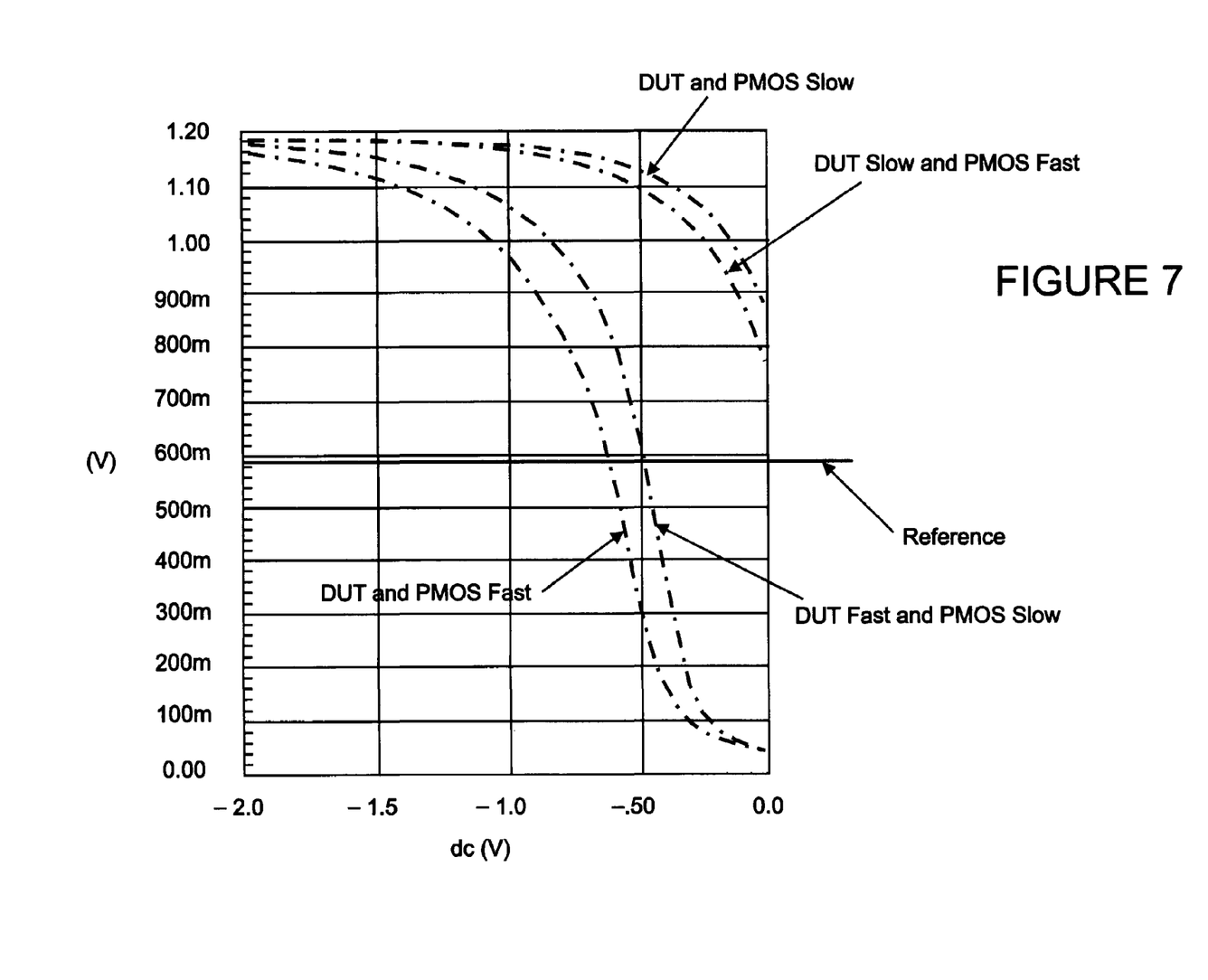
FIG. 7: a diagram showing the values of the voltages at the input of the comparator when a bipolar transistor is used to generate the injected current.

FIG. 7 illustrates the simulation results of a configuration in which the current is generated with a bipolar transistor. Such configurations allow a compensation of the temperature dependence of the DUT. This effect is due to the opposite sign in the temperature coefficient between both devices. However, it is necessary to use a start-up circuit to properly start the generation of the injected current. The detection is also established when the DUT is working in the fast conditions. It has been also checked that this solution allows a good behavior in temperature.

Figure 8:
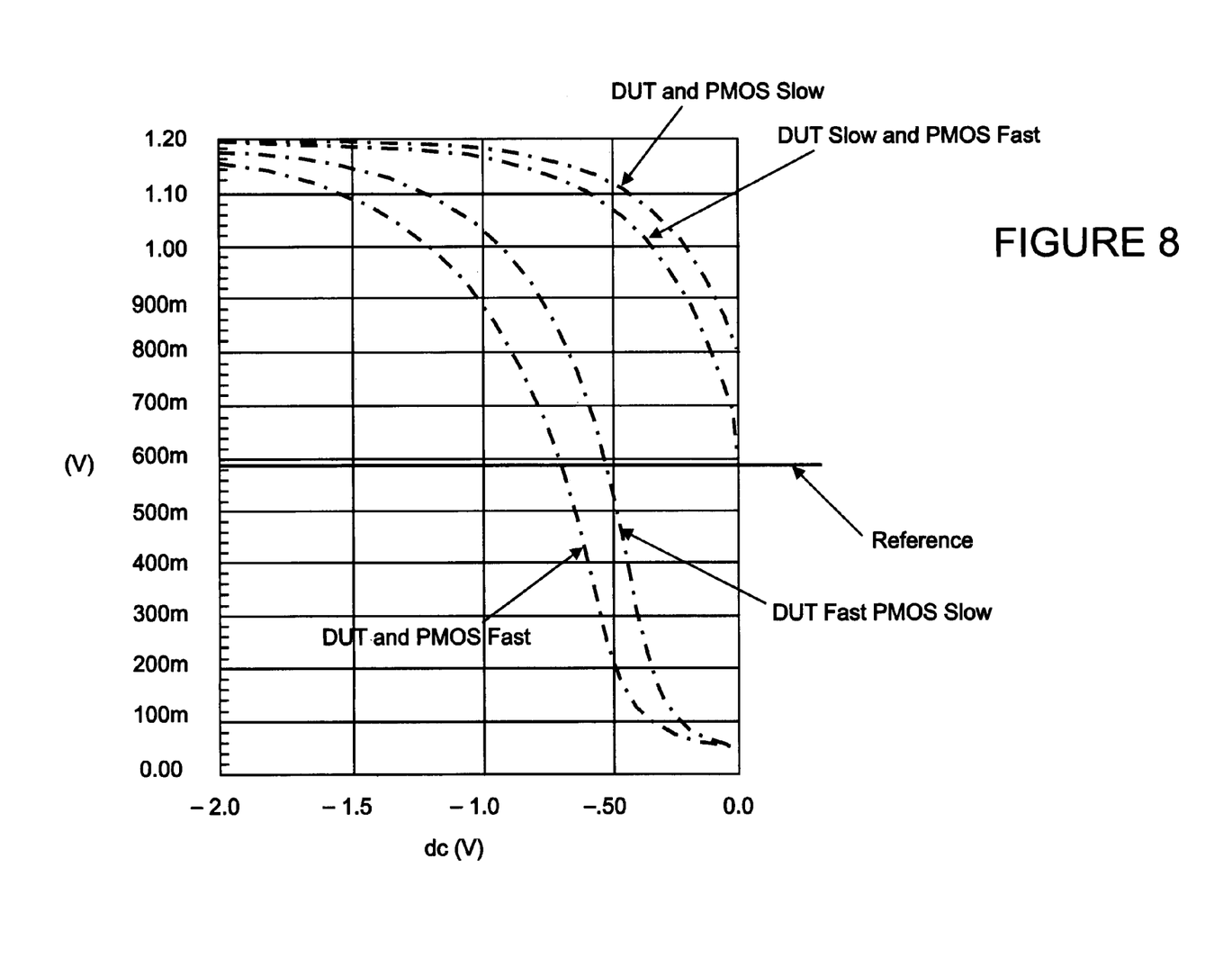
FIG. 8: a diagram showing the values of the voltages at the input of the comparator when a diode is used to generate the injected current.

Taking into account that the corresponding coefficient in temperature for the diodes is opposite to the sign in the DUT, a configuration using a diode to generate the injected current would be also possible. Nevertheless, a start-up circuit would be also needed to start the generation of the current. As in the previous examples the detection can be established with a voltage reference of 600 mV, see FIG. 8. Further, a good temperature behavior can also be obtained.

Figure 9:
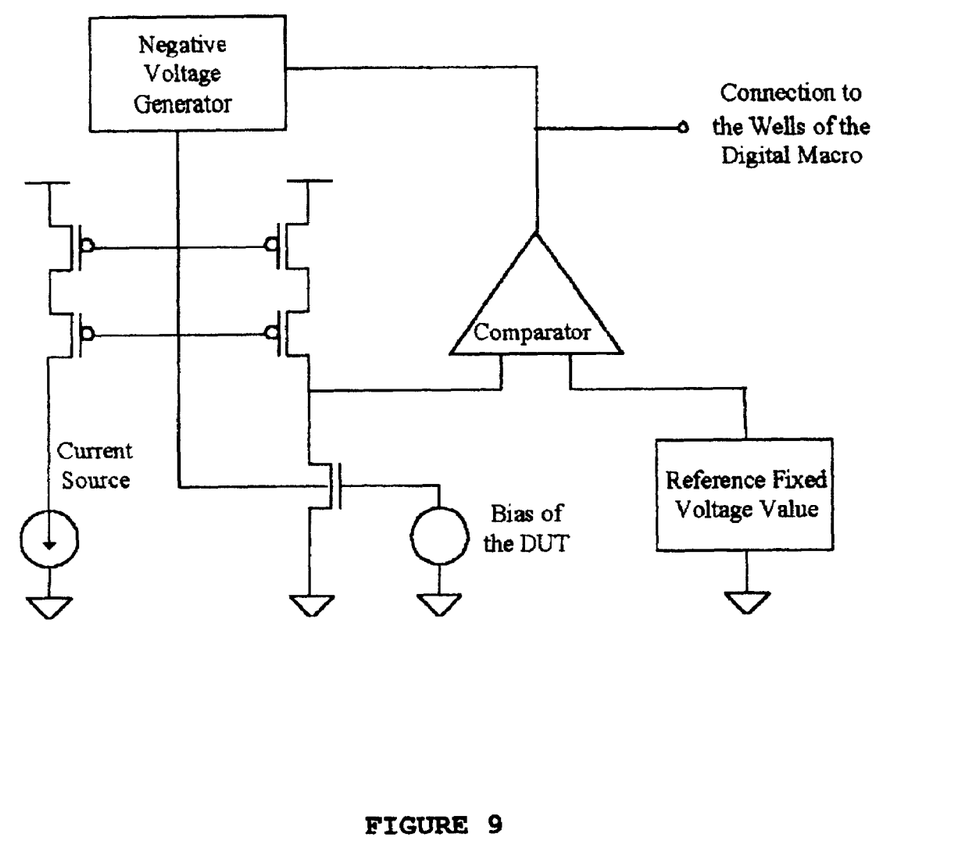
FIG. 9: a block diagram showing a closed loop configuration to automatically adjust the $V_t$ value.

The closed loop operation is carried out connecting the output of the comparator to the chip enable input signal of a negative voltage generator (in the case of NMOS DUTs). Typically this negative voltage generator can be a charge pump. The output of the generator is directly connected to the well contact of the DUT as depicted in FIG. 9.

By means of the proposed invention, it is possible to adjust the threshold voltage of the device under test (or a set of devices under test connected in parallel) using a voltage reference fixed for any kind of working temperatures or operation conditions. The well potential for the device under test is shifted up to the point in which the sensed $V_{ds}$ is equal to the reference voltage value. The use of a circuit like a charge pump would allow the generation of the required bias voltage.

What is claimed is:

1. A semiconductor device comprising
    a test circuit containing at least one transistor as a device under test(DUT)having a drain, a source, a gate and a channel region under the gate between the drain and the source in a well with a short channel length,
    a reference circuit providing a fixed reference voltage value,
    a bias circuit applying a bias voltage to the gate of the device under test (DUT),
    a current circuit providing a fixed current to the drain of the device under test (DUT),
    a comparator circuit comparing the voltage at the drain of the test circuit with the output of the reference circuit and providing a comparison result.

2. The semiconductor device according to claim 1, wherein the bias voltage applied to the gate of the DUT is of a value close to the threshold voltage value of the DUT.

3. The semiconductor device according to claim 1, wherein the bias circuit comprises a bandgap reference circuit.

4. The semiconductor device according to claim 1, wherein
the current circuit comprises a current source and a current mirror circuit connected between said current source and the drain contact of the DUT.

5. The semiconductor device according to claim 1, wherein a well potential generator for generating a well potential is provided, said well potential generator being coupled to the output of the comparator circuit receiving the comparison result as an input and to a well contact of the DUT for applying the well potential as an output.

6. The semiconductor device according to claim 5, wherein
the well potential generator applies the well potential to the well contact of the DUT when the received comparison result indicates that the output voltage of the test circuit is smaller than the output voltage of the reference circuit.

7. The semiconductor device according to claim 6, wherein the well potential generator provides a well potential up to the point in which the received comparison result indicates that the output voltage of the test circuit is equal to the output voltage of the reference circuit.

8. The semiconductor device according to claim 5, wherein said well potential generator comprises a voltage source for providing a fixed potential to the well of the DUT and the well of further devices of a digital circuit wherein said digital circuit is integrated in the semiconductor device.

9. The semiconductor device according to claim 5, wherein
said well potential generator comprises a charge pump as a voltage source.

10. A Method for detecting variations of the threshold voltage $V_t$ in a semiconductor device in sub-micron technology comprising a test circuit containing at least one transistor as a device under test (DUT) having a drain, a source, a gate and a channel region under the gate between the drain and the source in a well with a short channel length, said method comprising:
providing a fixed reference voltage value by a reference circuit,
applying a bias voltage to the gate (3) of the device under test (DUT) by a bias circuit,
providing a fixed current to the drain (2) of the device under test (DUT) by a current circuit,
comparing the voltage at the drain (2) of the test circuit with the output of the reference circuit and providing a comparison result by a comparator circuit.

11. The method according to claim 10, wherein the method further comprises providing a well potential to the well of the test circuit when the output voltage of the test circuit is smaller than the output voltage of the reference circuit until the output voltage of the test circuit is equal to the output voltage of the reference circuit.

* * * * *